United States Patent [19]

Ohkuma

[11] Patent Number: 4,557,785
[45] Date of Patent: Dec. 10, 1985

[54] APPARATUS FOR WET PROCESSING
[75] Inventor: Yuji Ohkuma, Kawasaki, Japan
[73] Assignee: Fujitsu Limited, Kawasaki, Japan
[21] Appl. No.: 625,155
[22] Filed: Jun. 27, 1984
[30] Foreign Application Priority Data
  Jun. 29, 1983 [JP] Japan .................. 58-117364
[51] Int. Cl.⁴ ............ H01L 21/306; C23F 1/00; B44C 1/22; C03C 15/00
[52] U.S. Cl. ................ 156/345; 134/33; 134/198; 156/639; 156/640
[58] Field of Search ............ 156/345, 639, 640, 662; 134/33, 198

[56] References Cited

U.S. PATENT DOCUMENTS 3,664,354 5/1972 Minbiole et al. .......... 156/345 X

FOREIGN PATENT DOCUMENTS 0044567 1/1982 European Pat. Off. .
0158634 12/1980 Japan .................. 156/345
390397 8/1965 Sweden .

OTHER PUBLICATIONS

IBM Technical Disclosure Bulletin, vol. 16, No. 9, Feb. 1974, "Semiconductor Wafer Wet Processing Rotating Apparatus".
Patent Abstracts of Japan, vol. 6, No. 191, Sep. 30, 1982 of JP-A-57-104669.

Primary Examiner—William A. Powell
Attorney, Agent, or Firm—Armstrong, Nikaido, Marmelstein & Kubovcik

[57] ABSTRACT

An apparatus and system for wet processing a substrate, which can be used for chemical processing such as etching or washing a semiconductor substrate are disclosed. The apparatus has a processing chamber in which the substrate is wet processed. Processing liquid is injected into the processing chamber through an opening and nozzles, and the substrate is floated in the injected liquid and rotated about its center axis by streams of the injected liquid. The wet processing system is composed from a processing apparatus as mentioned above, a water bearing system which transfers the substrate by means of a water stream, and a spin dryer. The water bearing system also serves as a washing apparatus. Shutters are provided between the water bearing and the processing chamber or the spin dryer, the shutters controlling the water levels between these elements.

11 Claims, 8 Drawing Figures

FIG. 4A
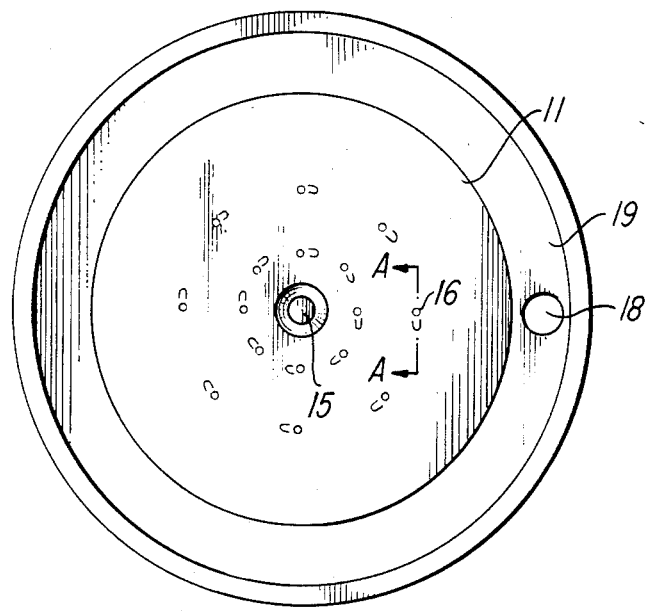
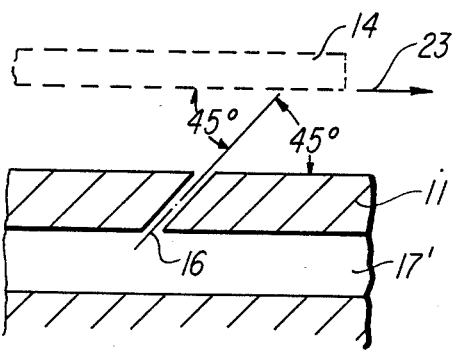
FIG. 4B

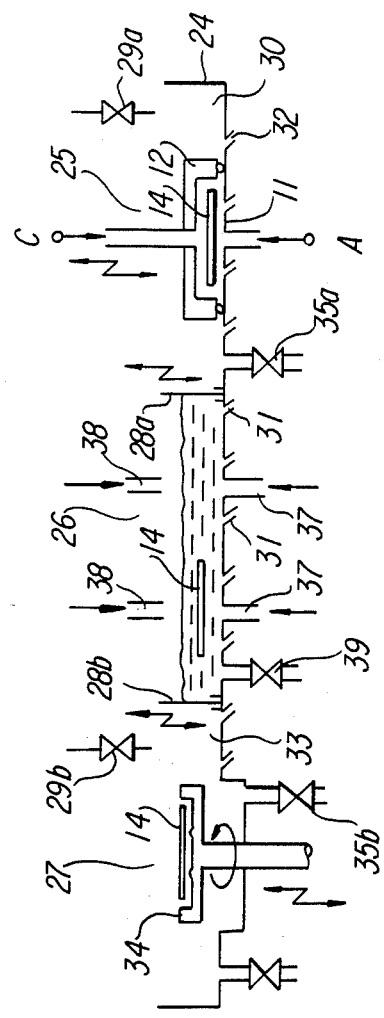

APPARATUS FOR WET PROCESSING

BACKGROUND OF THE INVENTION

1. Field of the Invention

This invention is related to an apparatus or system for wet processing, especially for use in a washing or etching process of substrates in semiconductor device fabrication. The present invention provides an apparatus and system which continuously processes the substrates one by one.

2. Description of the Prior Art

In semiconductor manufacturing there are many wet processes, such as washing and etching of the substrates. For such processes, a batch process has been used, in which a number of substrates are placed in a bucket and etched in the basket, or the substrates are placed on a rack and immersed in the etchant. In such batch processes, it is difficult to precisely control the etching because during the time the etchant in the bucket is replaced by water or the rack is taken out from the etchant and immersed in water, the etching of the substrates proceeds. Moreover, it is difficult to process the surface uniformly, since the etchant trickles from one side of the substrate when the substrate is lifted from the etchant.

In some cases, the surfaces of the substrates are polluted or oxidized by air during the time they are moved from one process to the next process. Therefore, if the progress of a process is delayed for some reason, the preprocessing is again required. The above problems have an undesirable influence on the yield and dispersion of the characteristics of products.

In order to overcome the above problems, recently the process for fabricating semiconductor devices has shifted from batch processing to one by one processing.

Fundamental in the one by one chemical processing is to hold the substrate with a chuck and treat the substrate in a cup containing the chemicals (cup treatment), or spray the chemicals on the surface of the substrate (spray treatment).

One example of cup treatment is shown schematically in FIG. 1. The cup 1 is filled with the chemicals of etchant or water 2 which is added from the bottom of the cup 1 and overflows from the edge of the cup 1. The arrow lines 5 indicate the direction of flow of the etchant or water. The substrate 4 is fixed to the chuck 3 by a vacuum, for example, and is immersed into the etchant 2. The chuck 3 is rotated about its axis as shown by the arrow 6, in order to treat the surface of the substrate uniformly.

A typical example of spray treatment is shown schematicaly in FIG. 2. The substrate 4 is fixed on the chuck 3 and rotated about the axis as indicated by the arrow 6. The chemicals or water 2 is sprayed on the surface of the substrate 4 from a nozzle 7. A cover 8 prevents the splash of chemicals.

In such prior art systems, the substrates or slices to be processed are held by vacuum chucks, for example, and it is, therefore, impossible to treat both sides of the slice at the same time. Thus, this process can not be applied to specific treatments which require treatment of both sides of the slices at the same time.

SUMMARY OF THE INVENTION

The primary object of the present invention is to provide an apparatus for wet processing which can continuously treat substrates one by one.

another object of the present invention is to provide an apparatus for wet processing which can process both sides of a substrate at the same time.

A further object of the present invention is to increase the accuracy and uniformity of wet processing over the surface of the substrate to be processed and increase the production yield.

Still another object of the present invention is to provide a system for wet processing which can treat substrates continuously, one by one.

The above objects of the present invention are attained by providing an apparatus which handles the substrates with a stream of liquid used for the wet processing. The substrates flow down the stream of the processing liquid, and are rotated by jet streams of the processing liquid. The processing liquid is poured or sprayed over the surface of the substrates, and thus, the substrates are treated uniformly on both sides.

When the treatment is finished, the processing liquid is switched to pure water, and the substrates are conveyed by the stream of water one by one, like a conveyer system. As the substrates proceed along the water conveyer (or water bearing), the substrates are washed and cleaned by water sprayed over them.

At the end of the water bearing, there is a spin dryer. The substrate is positioned on the chuck of the spin dryer. When the substrate is positioned, a shutter closes and separates the spin dryer from the washing zone. Then the water in the spin dryer is extracted and the chuck of the dryer holds the substrate, and begins to rotate. Thus, the substrate is dried quickly.

By the above described process, the wet processed substrate is not exposed to air until just before the next process begins, therefore, the surface of the substrate, which is often very active after some chemical processes, is protected from poisoning or pollution by the ambient air.

BRIEF DESCRIPTION OF THE DRAWINGS

FIG. 4A is an over view of the apparatus of FIG. 3A showing the arrangement of nozzles; and FIG. 4B is a sectional view of the nozzle part.

FIG. 5 illustrates schematically the system of wet processing which conveys and treats the substrates one by one, according to the present invention.

DETAILED DESCRIPTION OF THE PREFERRED EMBODIMENT

Figure 1:
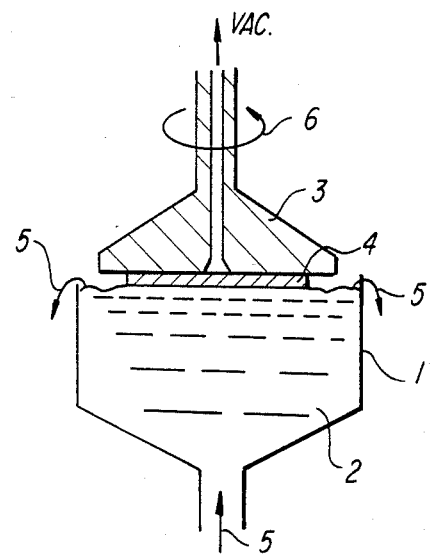
FIG. 1 illustrates schematically the principle of a prior art cup type wet processing apparatus.
Figure 2:
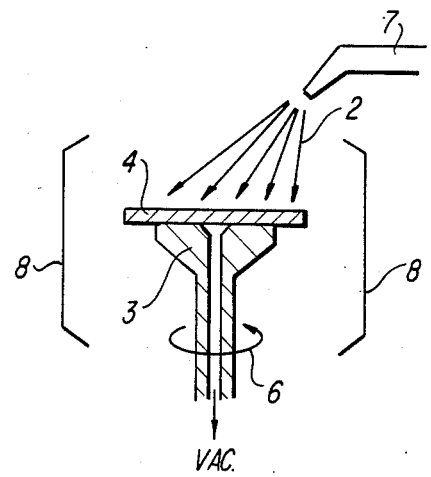
FIG. 2 illustrates schematically the principle of a prior art spray type wet processing apparatus.
Figure 3A:
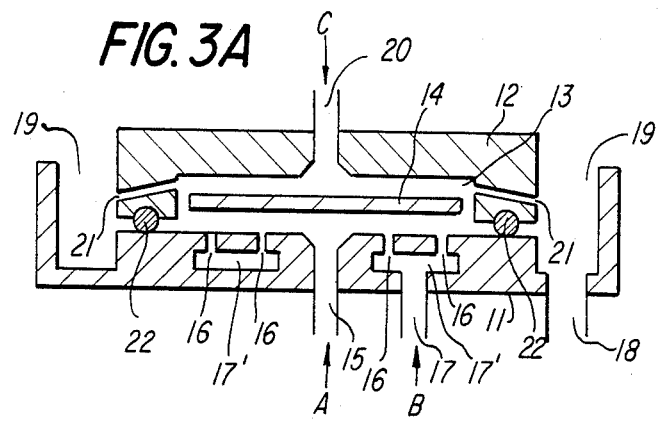
FIG. 3A illustrates schematically the principle of an apparatus for wet processing according to the present invention showing a section view of a main portion thereof.
Figure 3B:
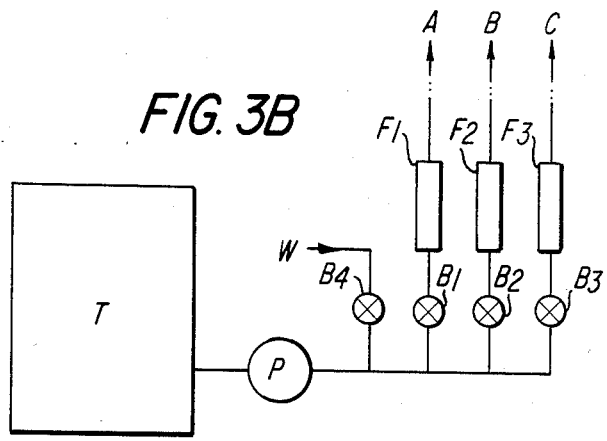
FIGS. 3B and 3C are block diagrams showing flow control systems for the apparatus of FIG. 3A.

FIGS. 3A and 3B are schematic diagrams illustrating the principle of an apparatus for wet processing according to the present invention. FIG. 3A is a cross-sectional view of the main part of the apparatus which has a circular form. As shown in the figure, a pedestal 11 and its cover 12 form a circular processing chamber 13. A plan view of the pedestal 11 is shown in FIG. 4A. The substrate to be processed 14 (a semiconductor substrate, for example) is set in the processing chamber 13. Processing liquid is spouted by a pump towards the back surface of the substrate 14 from an opening 15 formed at the center of the pedestal 11. The substrate 14 is lifted and supported by the stream of processing liquid.

The processing liquid may be water, chemical etchant or some other liquid depending upon whether the process is washing, etching or for some other purpose to treat the substrate.

A plurality of small nozzles 16 are located around the opening 15 concentric to the opening. The nozzles are fabricated in the pedestal 11 inclined with respect to the bottom surface of the pedestal. The angle of incline or slant of these nozzles are directed in a definite direction around the opening 15 as shown in FIG. 4A. FIG. 4B shows a partial cross-sectional view of a nozzle along the arrowed line AA in FIG. 4A. As shown in the figure, the nozzle 16 is, for example, inclined 45° with respect to the bottom surface of the pedestal 11, and all of the nozzles 16 are inclined in the counter-clockwise direction, for example, around the opening 15.

The nozzles 16 are branched from a trench 17' which is provided under the bottom of the pedestal, and connected to a second opening 17 through which the processing liquid is pumped in. In the drawings, the trench 17' is arranged circularly around the opening 15 and buried in the pedestal 11. The processing liquid flows through the second opening 17, the trench 17' and the nozzles 16, and flows out at an angle with respect to the back surface of the substrate 14, and thus, the substrate 14 is moved toward the direction shown by the arrow 23. Since a number of nozzles 16 are provided around the center opening 15 inclined in one rotational direction, the substrate 14 is rotated about its center by the jet streams out of the nozzles 16. This operation is similar to that of an air conveyer or air bearing which is used widely for handling planar substrates.

A cover 12 is provided over the pedestal 11, which covers the pedestal and together with an O-ring 22, forms a processing chamber 13. The O-ring 22 seals the gap between the pedestal 11 and the cover 12. The pedestal 11, cover 12 and O-ring 22 are made from a material which is not stained by the processing liquid. Vinyl chloride resin, for example, may be used. Sometimes glass or acrylic resin may be used in order to observe the behavior of the substrate in the processing chamber. It is important that the material used is not stained by the processing chemicals.

Referring to FIG. 3A, a third opening 20 is provided at the center of the cover 12, through which the processing liquid is poured or sprayed over the surface of the substrate 14, and the substrate is thus, processed. Several exhaust openings 21 are provided on the periphery of the cover 12. The used processing liquid is discharged from the exhaust openings 21 along with some gases which are generated by the processing (etching, for example).

A ditch 19 is provided around the pedestal 11 which collects the overflow liquid and exhaust through an exhaust pipe 18. In some cases, the collected liquid at the exhaust pipe 18 may be reused by circulating it with a pump to the openings 15, 17 or 20.

FIG. 3B shows an example of a piping system to provide the processing liquid to the above described processing apparatus. In the figure, T designates a tank for holding the processing liquid. P is a pump which pumps the liquid. $B_1$, $B_2$, $B_3$ and $F_1$, $F_2$, $F_3$ are repsectively control valves and flow meters. W designates water inlet and $B_4$ is a stop valve. The outlets A, B and C of the respective flow meters $F_1$, $F_2$ and $F_3$ are connected to the first, second and third openings 15, 16 and 20 in FIG. 3A. The arrow lines A, B and C show the direction of liquid flow.

The liquid flows A, B and C are respectively controlled by the control valves $B_1$, $B_2$ and $B_3$ to a predetermined value indicated in each of the flow meters $F_1$, $F_2$ and $F_3$. These values are determined, beforehand by emperical data, in order to float and keep the substrate in the middle of the processing chamber 13, and rotate it about the axis at the center of the substrate at a desired speed. Once the flow rate is determined, it is unnecessary to further adjust the control valves. An example of the water flow required to keep a silicon substrate with a 4 inch diameter and approximately 0.5 mm thick in the center of the processing chamber whose diameter is 116 mm was approximately 0.3, 1, and 0.5 liters/min for openings A, B and C, respectively. In the above condition, the substrate rotated in the water with a speed of approximately 40 turns/min.

In the processing apparatus of the present invention, the substrte 14 is placed on the pedestal 11, the cover 12 is pressed down to the O-ring 22 and the processing chamber 13 is sealed. The processing chamber 13 is filled with a processing liquid (water or chemicals) through the openings 15, 16 and 20. The substrate 14 floats in the processing liquid at almost the center of the processing chamber 13, by adjusting the streams from the openings 15 and 20. The substrate is rotated around its center axis, with a rotating speed of 30–60 turns/min, by adjusting the jet streams from the nozzles 16 and controlling the stream of B in FIGS. 3A and 3B. The substrate is processed uniformly by the stream of the processing liquid.

When the processing is finished and the processing liquid is switched from chemical to water, it is done very quickly as compared to an ordinary batch system, so, there is no problem of over processing, such as over etching.

For example, a silicon substrate of 4 inch diamter, covered with a silicon dioxide film was etched with hydrofluoric acid, and no difference was found in the etching depth on both surfaces of the substrate. Moreover, the etching rate was increased about 10% as compared to that of ordinary batch processing.

FIG. 5 shows an example of a wet processing system of the present invention which is installed in a chemical processing line for substrates. The processing line is composed from a substrate transfer apparatus 24, a wet processing apparatus of the present invention 25, conventional washing apparatus 26 and conventional centrifugal spin dryer 27.

In this example, the substrate 14 is transferred by a water bearing system, that is similar to an air bearing or air conveyer system. Namely, the substrate is transferred in a stream of water by jet streams of water injected into the stream at an angle or slant in the direction of transfer. Shutters 28a and 28b are provided between the apparatus 25, 26 and 27.

The substrates are placed one by one by an appropriate transfer robot (not shown), on a pedestal 11 which is a part of the bottom of the transfer apparatus 24. Of course, the substrates may be placed manually. The cover 12 is pressed down, and wet processing, as described above, is performed by the processing apparatus 25 of the present invention. When the chemical processing is finished, the chemical is switched to water and preliminary washing is performed. This preliminary washing has an effect of quenching the chemical process (etching process, for example) and prevents over processing.

A water valve 29a is then opened and pure water is poured into the first bucket 30 which contains the wet processing apparatus 25. It is not always necessary to provide a water inlet in the first bucket. Water may be poured into the first bucket through the openings A, C or nozzles 32 which correspond to those of FIG. 3A.

When the level of water becomes equal to that in washing apparatus 26, the shutter 28a is opened and both water streams in bucket 30 and washing apparatus 26 are joined. The substrate is then transferred into the washing apparatus 26, by water jets from nozzles 32 and 31. At this time, it is preferable to make the water level of the bucket 30 a little lower than that of the washing apparatus 26, this small difference in water level prevents the rushing of the water in bucket 30 (which is still contaminated with processing chemicals) into the washing apparatus 26 (which is filled with pure water). Following this, the shutter 28a and the water valve 29a are again closed, and the water in bucket 30 is extracted through an exhaust valve 35a. The cover 12 is then lifted up and the next wafer is fed into the wet processing apparatus 25, and the same processing cycle is repeated.

During this time, the substrate 14 in the washing apparatus 26 is cleaned by pure water in the transfer apparatus (water bearing) 24, part of which includes the washing apparatus 26. This part of the water bearing may be considered as a washing zone. In order to ensure the washing effect, openings 37 and shower nozzles 38 are provided on the bottom and upper part of the washing zone respectively. The used water in the washing zone overflows or is extracted from an exhaust valve 39. The substrate 14 is transferred by water jets from nozzles 31, which are provided on the bottom of the washing zone. The water stream is controlled so that the washing process is finished while the substrate is moving toward the end of the washing zone.

It is desirable in the above washing treatment to treat a single substrate at a time because when a new substrate is added to the washing zone while the previous substrate still remains, the former substrate will be contaminated by the newly added substrate. However, if the washing zone is very long or contamination is not so serious, plural substrates may be handled in a same washing zone.

When the washing of the substrate 14 is finished, the shutter 28b is opened and the substrate is led into the second bucket 33, which has already been filled with water through the water valve 29b, and the water level is adjusted to that of the washing apparatus 26. The substrate 14 is transferred by the water bearing to a stopper (not shown). The shutter 28b and the water valve 29b are then closed, and the water in the second bucket 33 is exhausted through an exhaust valve 35b. As the water level goes down, the substrate 24 settles on a chuck 34 of a spin dryer 27. The chuck 34 is lowered beforehand to the bottom of the second bucket 33, in order to receive the substrate 14, and the stopper described above defines the position of the substrate 14 on the chuck 34.

After the water is exhausted, the chuck 34 is raised and the chuck 34 begins to rotate about its shaft. The substrate 14 is quickly dried by the spin dryer 27. The substrate is then shifted to the next step of processing by either a robot (not shown) or manually.

As can be seen in the above explanation, in the processing system by the present invention, the chemically processed surface of the substrate, which is usually very active and easily poisoned or polluted by ambient air, is kept in pure water until it is dried by the spin dryer, and, therefore, the contamination of the surface is avoided.

Figure 3C:
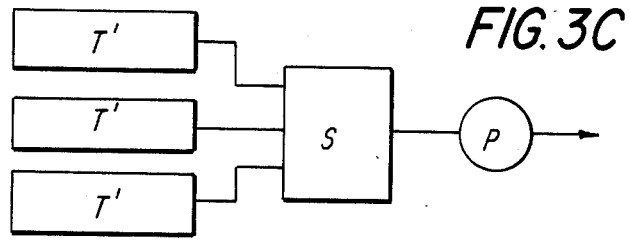

In the above embodiment, the substrate was treated with only one wet processing, but it will be clear to one skilled in the art that the apparatus disclosed above is very convenient to link in tandem with a plurality of the apparatuses like that shown in FIG. 5. Further, by varying the processing chemicals in each section of the system, it is possible to apply any kind of chemical treatment in series to the substrate. As shown in FIG. 3C, a plurality of tanks T' can be used for storing different processing liquids. The desired processing liquid can be selected by means of a switch S. In other variations, many kinds of chemical treatments can be performed in a single wet processing apparatus by switching the chemicals when one treatment is finished.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. A wet processing apparatus for a planar substrate, said apparatus comprising a processing chamber, wherein said substrate is processed in said processing chamber, said processing chamber comprising a pedestal and a lid which covers said pedestal, said pedestal and lid defining said processing chamber therebetween, and a plurality of opening means through which streams of a processing liquid are injected, said substrate being floated and rotated by said streams of processing liquid wherein said opening means comprises:

a first opening provided at the center of said pedestal, wherein the processing liquid is injected into said processing chamber through said first opening;

a plurality of nozzles positioned around said first opening, wherein said nozzles are inclined with respect to said substrate such that the processing liquid flowing therethrough rotates said substrate; and a trench, through which the processing liquid is supplied to each of said nozzles, said trench having a second opening through which the processing liquid is supplied, and wherein said lid comprises:

a third opening through which the processing liquid is injected into said processing chamber; and exhaust openings arranged on the periphery of said lid through which the processing liquid overflows.

2. A wet processing apparatus for a planar substrate according to claim 1, further comprising an O-ring provided at a periphery of said pedestal for sealing said processing chamber when said lid is pressed towards said pedestal.

3. A wet processing apparatus for a planar substrate according to claim 1, further comprising:
- a tank for storing processing liquid;
- a pump for pumping said processing liquid from said tank to said first, second and third openings; and
- a plurality of control valves each controlling respectively the stream of processing liquid supplied to each of said first, second and third opening.

4. A wet processing apparatus for a planar substrate according to claim 3, further including a plurality of flow meters, each flow meter connected to a respective one of said control valves, said flow meters indicating the flow of liquid through the respective said control valves.

5. A wet processing apparatus for a planar substrate according to claim 3, further comprising:
- a plurality of tanks each storing a different processing liquid, wherein the processing liquid necessary for a particular processing step is switched to said pump; and
- a switching means for switching said different processing liquids to said pump.

6. A wet processing system for a planar substrate comprising:
- a processing chamber in which said substrate is wet processed, said processing chamber including openings through which processing liquid is injected, wherein said substrate is floated in the injected liquid and rotated around its center axis by a stream of the injected liquid;
- a washing means including a water bearing through which said substrate is transferred by a water jet and at the same time is washed;
- a spin dryer for drying the substrate;
- a first shutter for separaing the liquid in said washing means from the liquid in said processing chamber; and
- a second shutter for separating the liquid in said washing means from the liquid in said spin dryer.

7. A wet processing system for a planar substrate according to claim 6, wherein said washing means comprises:
- at least one water shower for injecting pure water on the surface of said substrate moving along the water bearing.

8. A wet processing system for a planar substrate according to claim 6, wherein said washing means comprises:
- at least one water inlet arranged at the bottom of said washing means, wherein pure water is supplied into the washing means through said water inlet.

9. A wet processing system for a planar substrate according to claim 6, wherein said washing means comprises:
- a plurality of nozzles arranged on the bottom of said washing means and inclined toward the direction of movement of the substrate, wherein pure water is injected through said nozzles.

10. A wet processing system for a planar substrate according to claim 6, further comprising:
- a tank for storing processing liquid;
- a pump for pumping said processing liquid from said tank; and
- a plurality of control valves each controlling respectively a stream of processing liquid to the processing chamber.

11. A wet processing system for a planar substrate according to claim 6, further comprising a plurality of tanks each storing a different processing liquid, wherein said pump pumps the processing liquid necessary for a particular processing step.

* * * * *